(12) United States Patent
Cuignet et al.

(10) Patent No.: US 8,742,840 B2
(45) Date of Patent: Jun. 3, 2014

(54) VERY HIGH EFFICIENCY FLEXIBLE TRAVELLING WAVE AMPLIFIER

(75) Inventors: Etienne Cuignet, Saint-Ghislain (BE); Philippe Fayt, Mont-sur-Chienne (BE); Emile Tonello, Saint-Lys (FR)

(73) Assignee: Thales, Neuilly sur Seine (FR)

( * ) Notice: Subject to any disclaimer, the term of this patent is extended or adjusted under 35 U.S.C. 154(b) by 154 days.

(21) Appl. No.: 13/278,039

(22) Filed: Oct. 20, 2011

(65) Prior Publication Data
US 2012/0268201 A1  Oct. 25, 2012

(30) Foreign Application Priority Data
Oct. 22, 2010  (EP) ..................................... 10290571

(51) Int. Cl.
*H03F 7/00*  (2006.01)
*H03F 7/06*  (2006.01)

(52) U.S. Cl.
USPC ........................................... 330/4.5; 330/4.6

(58) Field of Classification Search
USPC ................ 315/3, 3.5, 3.6, 5.12, 4, 5.38, 5.43; 330/4.5, 4.6
See application file for complete search history.

(56) References Cited

U.S. PATENT DOCUMENTS

| | | | |
|---|---|---|---|
| 2,619,543 A | 11/1952 | Cutler | |
| 2,811,664 A | 10/1957 | Kazan | |
| 5,500,621 A * | 3/1996 | Katz et al. | ........................ 330/43 |
| 6,114,808 A * | 9/2000 | Takahashi | ........................ 315/3.5 |
| 7,579,778 B2 * | 8/2009 | Vaszari et al. | .................. 315/3.5 |
| 2005/0174169 A1 | 8/2005 | Jarno et al. | |

FOREIGN PATENT DOCUMENTS

WO  03/084057 A2  10/2003

* cited by examiner

*Primary Examiner* — Minh D A
(74) *Attorney, Agent, or Firm* — Baker & Hostetler LLP

(57) ABSTRACT

A travelling wave tube amplifier includes: a travelling wave tube comprising a cathode, a helix, an RF input, an RF output, and a plurality of collectors, and an electronic power conditioner providing power supply and electrode polarization to said travelling wave tube, wherein said electronic power conditioner comprises flexibility control means allowing to adjust, via control commands sent through a databus, the helix to cathode voltage and the collector voltages.

9 Claims, 5 Drawing Sheets

VERY HIGH EFFICIENCY FLEXIBLE TRAVELLING WAVE AMPLIFIER

CROSS-REFERENCE TO RELATED APPLICATION

This application claims priority to foreign European patent application No. EP 10290571.8, filed on Oct. 22, 2010, the disclosure of which is incorporated by reference in its entirety.

FIELD OF THE INVENTION

The current invention relates to a very high efficiency flexible travelling wave amplifier. It notably applies to telecommunication satellites.

BACKGROUND

Telecommunication satellites usually comprise a platform and a payload, the latter being comprising all equipments, notably all devices intended for generating and transmitting high power radiofrequency signals—hereinafter referred to as RF signals—toward the ground. Different known techniques are resorted to for transmitting high power RF signals.

A first technique is based on the solid state technology, and involves Solid State Power Amplifiers, usually referred to as SSPAs. SSPAs notably have the drawback of not being in a position to manage usually requested levels of RF power.

A second technique is based on the use of Travelling Wave Tube Amplifiers, hereinafter referred to as TWTAs. TWTAs notably comprise a Travelling Wave Tube, hereinafter referred to as TWT. Telecommunication satellite payloads nowadays extensively use TWTAs. TWTAs are particularly efficient devices for high power RF transmission channels, and allow for managing very high levels of transmitted RF power. However, TWTA relies on a tube-based technology which requests a very precise tuning, not only on the manufacturing level, but also as regard to the accuracy of electrical interfaces. A TWT is described in much detail below in reference to FIG. 1, and basically comprises an RF input and an RF output, a helix, and electrodes comprising a cathode emitting electrons forming an electron beam, an anode, usually referred to as "Anode Zero" or "Anode 0", focussing the electron beam, and a plurality of collectors.

Moreover, each produced TWTA is unique, and optimized for the purpose of a unique application, in terms of transmitted frequency, level of transmitted power and efficiency. Once designed, manufactured and possibly optimized, a TWTA and its associated control equipment have to keep operating the same way all through a satellite's assembly, integration and testing, and the in-flight mission of the satellite they are set in. That is: once the telecommunication satellite has been assembled, these equipments shall be operated under the specific conditions they have been designed for. Besides, the efficiency performance of TWTAs is frequency-dependent. Therefore, in parallel, a satellite intended for transmitting through a plurality of channels, shall be containing as many TWTAs, with related consequences in terms of cost, weight and bulk. Also, one TWTA being usually destined to transmit through one given channel over a typical mission duration of more than 15 years makes the payload design and the TWTA procurement very constraining and induces severe constraints in terms of risk management.

Wide-band TWTAs are known in the prior art, but existing devices typically suffer an efficiency degradation of about 2 percents compared to analogue TWTAs optimized in a narrower RF band.

For all above-mentioned reasons, a very long and costly part of a telecommunication satellite payload development is to propose a technical answer to the final customer needs, in terms of number of channels, frequency and power allocation, minimizing the power demand to the platform and within given reliability requirements.

SUMMARY OF THE INVENTION

One aim of the current invention is to palliate at least the above-mentioned drawbacks, by proposing a TWTA presenting an efficiency similar to that of known tuned narrow band TWTAs, while being able to be operated over a large variety of frequencies, as a wide band TWTA.

One further advantage of the current invention is that the TWTA offers the ability of being easily controlled not only on ground, but also during in-flight operations over a satellite mission.

One further advantage of the current invention is that a TWTA according to one of the described embodiments uses control electronics that can be adaptable for any existing high voltage electronic circuitry.

One further advantage of the current invention is that it alleviates resorting to redundancy of onboard TWTs for given applications, as all TWTs controlled within TWTAs following embodiments of the current invention, can be operated over a wide band.

One further advantage of the current invention is that it allows mission profile adaptation throughout the satellite payload life, without affecting the global payload efficiency.

One further advantage of the current invention is that it offers a phase flexibility affording the opportunity to replace phase shifter dedicated hardware in certain applications.

All the advantages cited below do present benefits in terms of schedule, weight, cost and optimization of failure management.

For that purpose, the current invention proposes a travelling wave tube amplifier comprising at least a travelling wave tube comprising a cathode, a helix, an RF input, an RF output, and a plurality of collectors $C_i$; an electronic power conditioner providing power supply and electrode polarization to said travelling wave tube; the travelling wave tube amplifier being characterized in that said electronic power conditioner comprises flexibility control means allowing to adjust, via control commands, the helix to cathode voltage, so as to allow adjusting the TWT operating frequency within a determined range with an optimal efficiency.

In an exemplary embodiment of the present invention, the flexibility control means can also be configured to adjust the collector $C_i$ voltages, the ratio between the helix to cathode voltage and collector $C_i$ voltages remaining constant.

In an exemplary embodiment of the present invention, the control commands can be sent through a databus.

In an exemplary embodiment of the present invention, the electronic power conditioner can comprise primary control means comprising a power cell driving a high voltage generation and control means comprising a multistage high voltage transformer whose primary side is controlled by said power cell (200) and generating the high voltages requested by said at least one collector, cathode and helix, said flexibility control means comprising means for adjusting a voltage reference driving a voltage control loop, said voltage control loop being driving the power cell through pulse width modulation.

In an exemplary embodiment of the present invention, the high voltage generation and control means can comprise a regulator attached to the secondary side of said multistage high voltage transformer and supplying a helix to cathode voltage, being adjusted to a helix to cathode voltage reference comprised in said flexibility control means.

In an exemplary embodiment of the present invention, the flexibility control means can further comprise a decoder issuing signal control words from said control commands, and said helix to cathode voltage reference can comprise a first digital-to-analog converter converting binary output words generated by a decoder based upon input binary words sent via said databus.

In an exemplary embodiment of the present invention, said means for adjusting the voltage reference can comprise a second digital-to-analog converter converting binary output words generated by the decoder based upon input binary words sent via said databus.

In an exemplary embodiment of the present invention, said decoder can generate n-bit output words towards the helix to cathode voltage reference, and m-bit output words, m being lower than n, towards the means for adjusting the voltage reference, based upon n-bit input words received from the databus.

In an exemplary embodiment of the present invention, the number m of bits of the output words towards the means for adjusting the voltage reference can be chosen so as to allow adjusting the RF signal phase.

In an exemplary embodiment of the present invention, the high voltage generation and control means can be implemented within a high voltage generation and control module comprising at its input the secondary side of the high voltage transformer also connected to a helix voltage accuracy controller formed by a bipolar transistor driven by the regulator, and whose emitter is attached to the ground through a dissipating element.

BRIEF DESCRIPTION OF THE DRAWINGS

These and other characteristics and advantages of the invention will be made clearer in view of the detailed description given below of a preferred embodiment, provided by way of an illustrative and non-limiting example only, as well as the accompanying drawings which represent.

DETAILED DESCRIPTION

Figure 1:
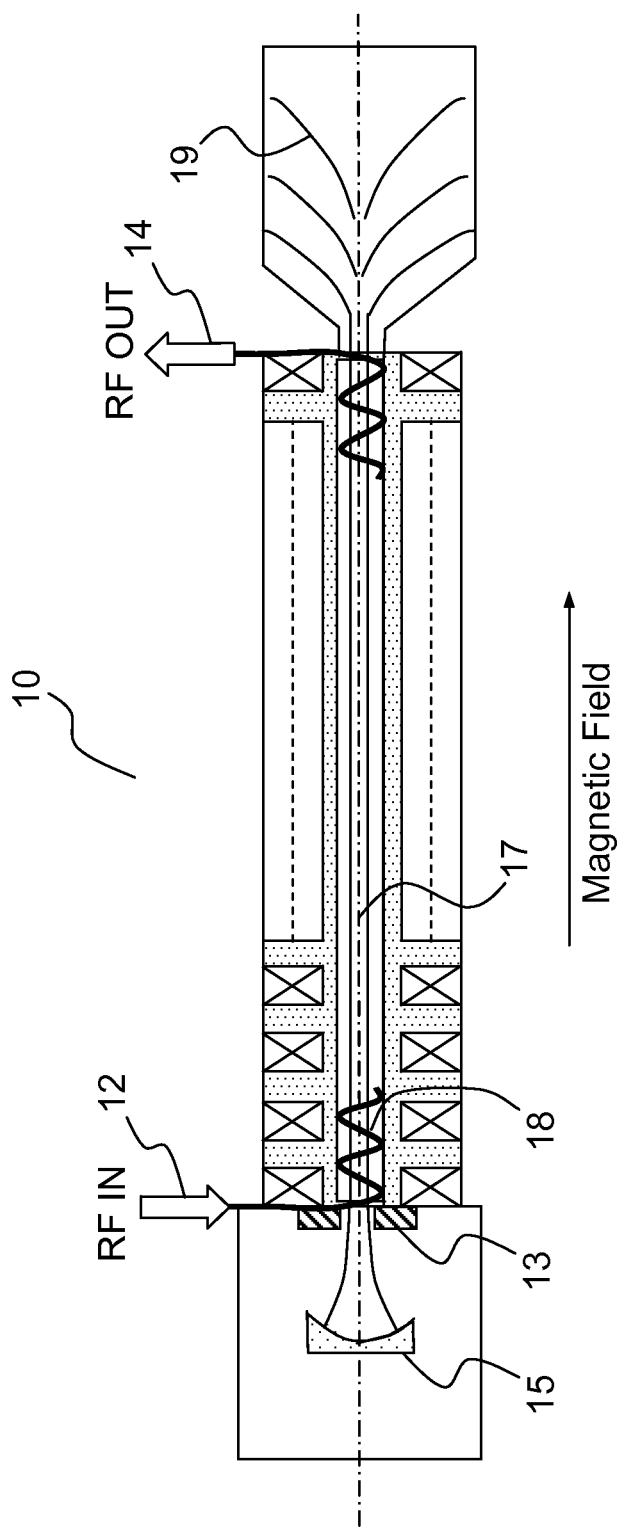
FIG. 1, a perspective view depicting a typical TWT known in the prior art.

FIG. 1 presents a perspective view depicting a typical TWT known in the prior art. A TWT is one of the key elements comprised in a TWTA.

A TWT 10 is basically an elongated vacuum tube comprising a radiofrequency input 12 and a radiofrequency output 14, a cathode 15 forming an electron gun generating an electron beam 17 focused and adjusted by an Anode Zero 13 passing through a helix 18 up to a plurality of collectors 19.

The cathode 15 is heated and emits electrons at one of its ends. A magnetic field is generated substantially around the helix 18 so as to contain the electrons as the focused electron beam 17. The electron beam passes through along the middle beam 17. The helix 18 is extending from the RF input 12 to the RF output 14. The electron beam 17 is finally striking the collectors 19. The RF signal travels along the helix 18 at a speed that is close to that of the electron beam 17. The amplification effect is due to the interaction between the electromagnetic field induced by the RF signal in the helix 18, and the electron beam 17 through a quantum phenomenon. For the purpose of improving the TWT yield in terms of energy, that is: optimizing recycling of the energy still available at the end of the electron beam 17, a plurality of collectors 19, typically: four or five, may be employed.

A TWTA usually comprises a TWT, associated with an additional Electronic Power Conditioner, hereinafter referred to as EPC, whose purpose is to supply the TWT with requested electrical operational conditions. The EPC is usually a DC-DC converter supplied in energy through a bus, and generating the voltage supply levels requested on each of the electrodes comprised in the TWT, with an accuracy level allowing to ensure the TWT performances, that is: the efficiency and the stability of the power transfer. Particularly, the high voltage between helix 18 and cathode 15 shall be enough accurate, as it is determining the TWT performance. Indeed, as for the helix—cathode voltage: accuracies on the order of 1 Volt are required, for voltages ranking up to several kilovolts; for instance, the required voltages between the helix and the cathode for applications within the Ku band is typically on the order of 6 kilovolts to 7.5 kilovolts. Control of said voltage levels is managed by the EPC.

The electrode referred to as Anode Zero 13 or "Anode 0", allows controlling the electron beam 17 generated by the cathode 15.

One particular type of TWTA is commonly referred to as LTWTA, standing for "Linearized TWTA". LTWTAs comprise an additional linearized preamplifier aiming at conditioning the RF signal level with the RF input 12 and providing compensation to spurious nonlinearity phenomena notably brought by the TWT. The embodiments of the current invention described hereinafter may notably apply to both types of TWTAs.

Usually, for TWTs already known in the prior art, the TWT manufacturers specify polarization parameters to the EPC according to the tuning parameters of the tube. Especially the helix voltage fixes the frequency operating point, while collector voltages are tuned so as to optimize the global TWT efficiency. As soon as the TWTA operating point is fixed, the TWTA cannot be operated in safe and efficient conditions at another frequency than one for which the operating point has been tuned. The present invention proposes to confer flexibility to the TWTA by controlling the helix voltage value within a range fixed by the awaited frequency excursion, together with the relevant correction of the collector voltages in order to maintain the optimum of efficiency. Controlling may for instance be done on ground level, prior to the launch of a mission, but also throughout the satellite in-flight mission, remotely, for example through the satellite onboard communication databus.

While the control of the helix voltage over the full range of flexibility allows for instance to transfer the TWT operating frequency from the lower part of the allowed RF band to the higher part—or inversely—the resolution of the control also allows to provide small variations of the RF signal phase resulting from the relevant voltage variation. Hence the proposed flexibility also offers the opportunity to correct the TWT output phase, which is a feature that may be especially useful in Multi Port Amplifiers, commonly referred to under the acronym MPA, where parallelized TWTAs require very accurate phase tuning, which usually resorts to costly phase shifter devices. MPAs allow generating more powerful signals by adding phase-coherent signals generated by a plurality of parallelized TWTAs.

According to the current invention, it is possible to adapt the helix to cathode voltage so as to allow an optimal efficiency, regardless of possible variations of the TWT operating frequency and proposes to control the collector voltages simultaneously with controlling the helix to cathode voltage through dedicated controls, in order to keep the amplifier efficiency optimal.

The present invention can be realized through appropriate means implemented within the EPC of a TWTA.

Figure 2:
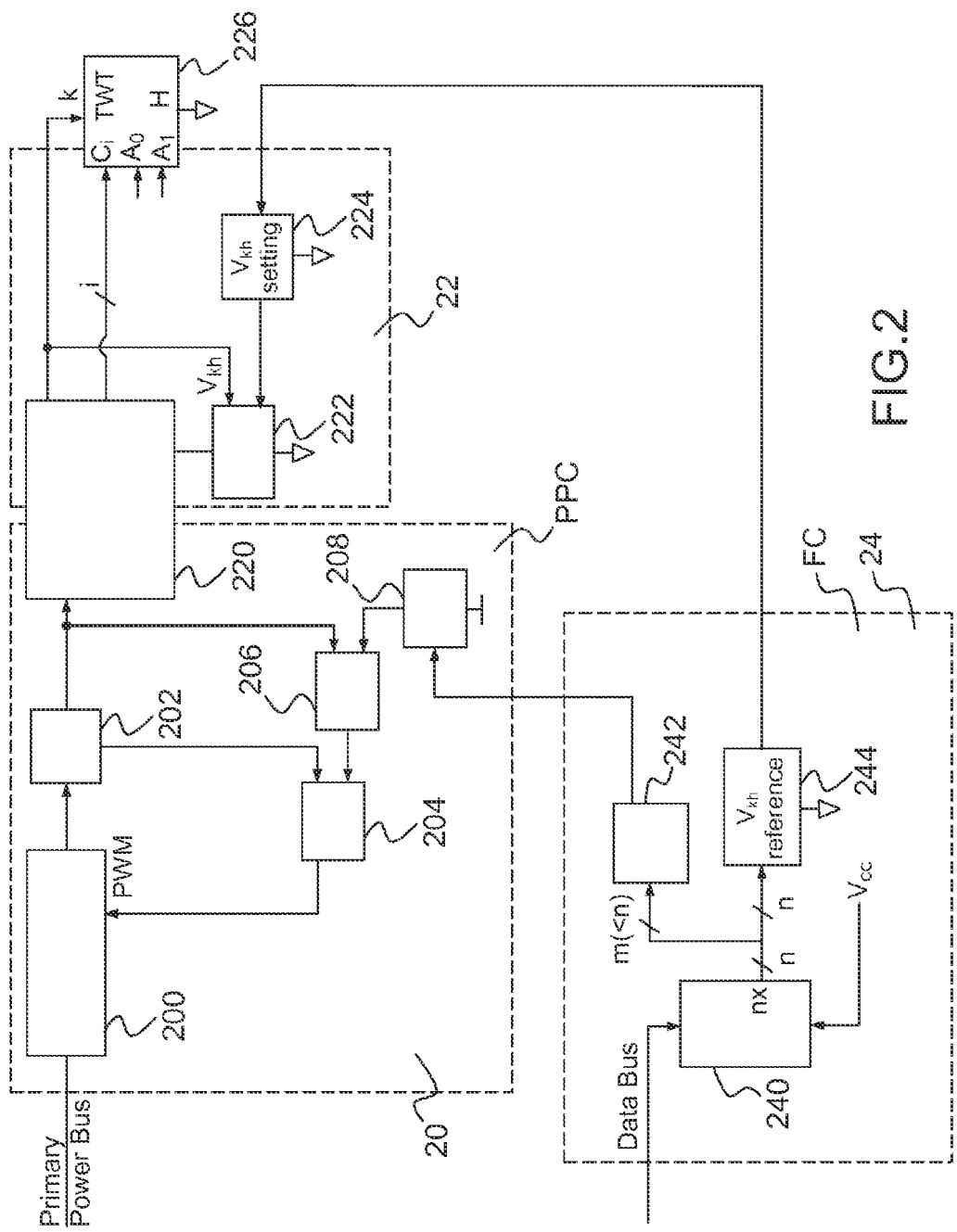
FIG. 2, a functional block diagram depicting an electronic power conditioner or EPC comprised in a flexible travelling wave tube amplifier, or TWTA, according to an exemplary embodiment of the current invention.

FIG. 2 presents a functional block diagram depicting an electronic power conditioner or EPC comprised in a flexible travelling wave tube amplifier, or TWTA, according to an exemplary embodiment of the current invention.

In a non-limitative example illustrated by the figure, a flexible TWTA comprises primary power control means 20 driving high-voltage generation and control means 22, and interfacing with flexibility control means 24.

The primary power control means 20 receive primary power from a primary power bus, and comprise a power cell 200 ensuring the control of the primary side of a high voltage transformer 220 described hereafter, and thus manage the power regulation, for example through two nested loops, one current control loop 204 driving the power cell through pulse width modulation, the current control loop 204 being driven by current sensing means 202, and by a voltage control loop 206. It is one specificity of the current invention that the voltage control loop 206 can be driven by an adjustable voltage reference 208. The means for adjusting the voltage reference 208 are comprised in the flexibility control means 24 and described further hereinafter. The primary power control means 20 then drive the high-voltage generation and control means 22. An exemplary embodiment of a high voltage generation and control module is described hereinafter by reference to FIG. 4.

At its input level, the high-voltage generation and control means 22 comprise a multistage high voltage transformer 220. The multistage high voltage transformer 220 can further comprise rectifiers and filters. The multistage high voltage transformer 220 generates the high voltages requested by a travelling wave tube 226; notably, the multistage high voltage transformer 220 can generate a plurality i of voltages for the plurality i of collectors $C_i$; besides, the high voltage transformer 220 can as well generate the "Anode 0" electrode voltage A0, and possibly an "Anode 1" electrode voltage A1 allowing adjusting the emitted power, through regulators not shown on the figure. It is one other specificity of the current invention, that the helix to cathode voltage $V_{KH}$ can be supplied through a regulator 222 attached to the secondary side of the multistage high voltage transformer 220, and driven by a helix to cathode voltage setting module 224. The helix to cathode voltage $V_{KH}$ setting module 224 is adjusted to a helix to cathode voltage reference 244 that is comprised in the flexibility control means 24. The helix to cathode voltage reference 244 can for instance comprise a DAC, and an exemplary embodiment thereof is described further below in reference to FIG. 5.

The flexibility control means 24 further comprises an n-bit decoder 240 receiving binary words from a data bus. The data bus can for instance be the communication data bus that is usually present onboard telecommunication satellites. The decoder 240 can generate a n-bit binary word output towards the helix to cathode voltage reference 244, as well as an m-bit (m being lower than n) word towards the voltage reference 208 referred to above, through a grounding isolation module 242.

Figure 3:
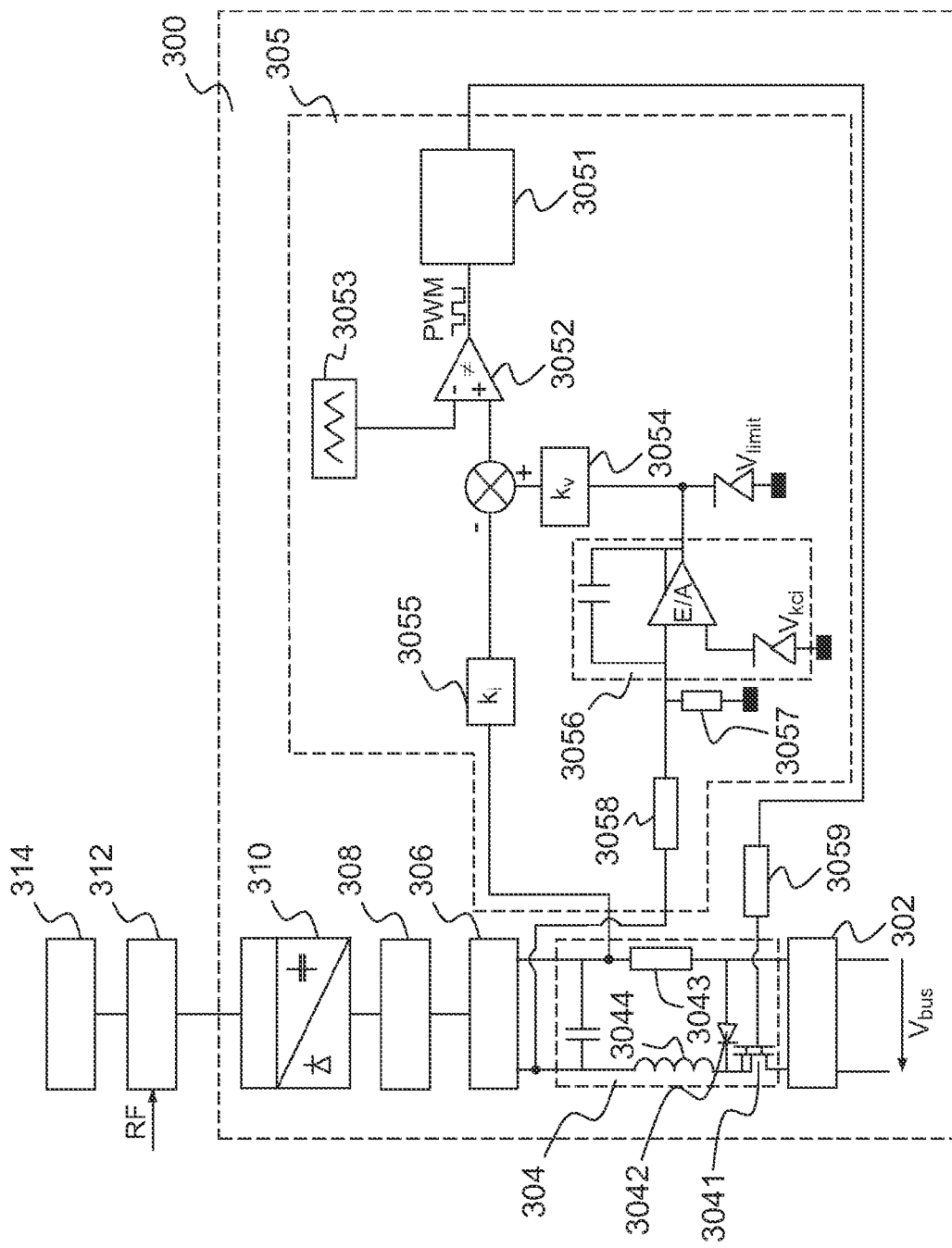
FIG. 3, a simplified electrical diagram depicting an EPC that is part of a flexible travelling wave amplifier according to an exemplary embodiment of the current invention.

FIG. 3 presents a simplified electrical diagram depicting an EPC that is part of a flexible linearized travelling wave amplifier according to an exemplary embodiment of the current invention.

An EPC 300 comprises an input filter 302 that interfaces with the power bus of the satellite, presenting a voltage $V_{BUS}$. The input filter 302 is then attached to an inverter 306 through a Buck type regulator 304 forming part of the power cell 200 described above in reference to FIG. 2. The Buck type regulator 304 for example implements typical components such as a buck switching cell comprising a switching transistor 3041 and a free wheel diode 3042, an output filter based on a buck inductance 3044 associated to an output capacitor 3045. A dedicated current measurement, for example based on a resistor 3043, can be used for the purpose of a back current control loop 3055. The buck type regulator power cell formed by the switching transistor 3041 and the free wheel diode 3042 may be driven by a dedicated regulation electronics comprised in a regulation module 305. In the regulation module 305, control signals from the regulation loop can be digitalized, for example by a comparator 3052 comparing the signal with a dedicated sawtooth signal 3053, and providing the pulse width modulation command to the buck transistor 3041 grid through a dedicated driver 3051, then possibly through a grid resistor 3059. The regulation module 305 implements the nested voltage control loop 206 and current control loop 204 cited below by reference to FIG. 2.

Regulation electronics comprised in the module 305 can be based on a back current control loop 3055 driven by an output voltage loop. The voltage loop may comprise a resistor bridge 3057, 3058 providing the measurement of the buck output voltage, that can be compared to the setting voltage $V_{KCi}$, for example through an error amplifier comprised in a voltage control loop block 3056. The gain of the voltage control loop can be controlled by a dedicated gain control block $K_V$ 3054. The voltage control loop output signal may be used as a reference for the current control loop. A Zener diode $V_{limit}$ comprised in the voltage control loop may provide adequate clamping of the voltage control loop signal output and consequently fix the maximum value allowed by the current control loop.

Figure 5:
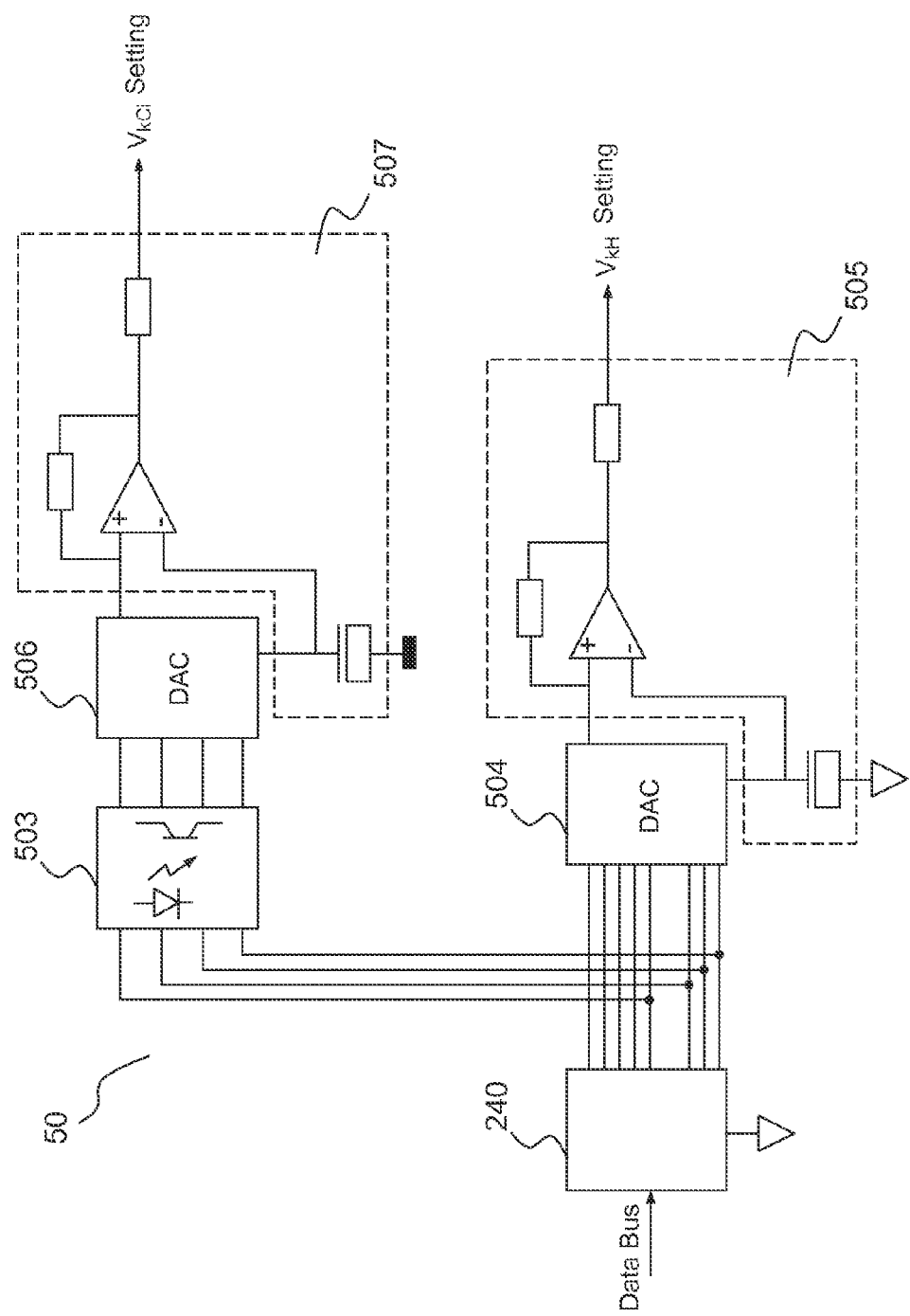
FIG. 5, a simplified electrical diagram depicting a flexibility control module, comprised in a flexible TWTA according to an exemplary embodiment of the current invention.

According to one specificity of the current invention, the regulation module 305 can further comprise voltage control adjustment means 3056, operating of which is described in details hereafter by reference to FIG. 5.

The inverter 306 is attached to a high voltage transformer 308 that forms or is part of the multistage high voltage transformer 220 cited below in reference to FIG. 2. A high voltage signal reshaping module 310 is attached to the high voltage transformer 308, and aims at providing high DC voltages requested by a TWT 312. The high voltage signal reshaping module 310 can for example contain high voltage capacitors and bridge diodes. The TWT 312 comprises an RF signal input, and outputs an output RF signal to an RF load 314.

Figure 4:
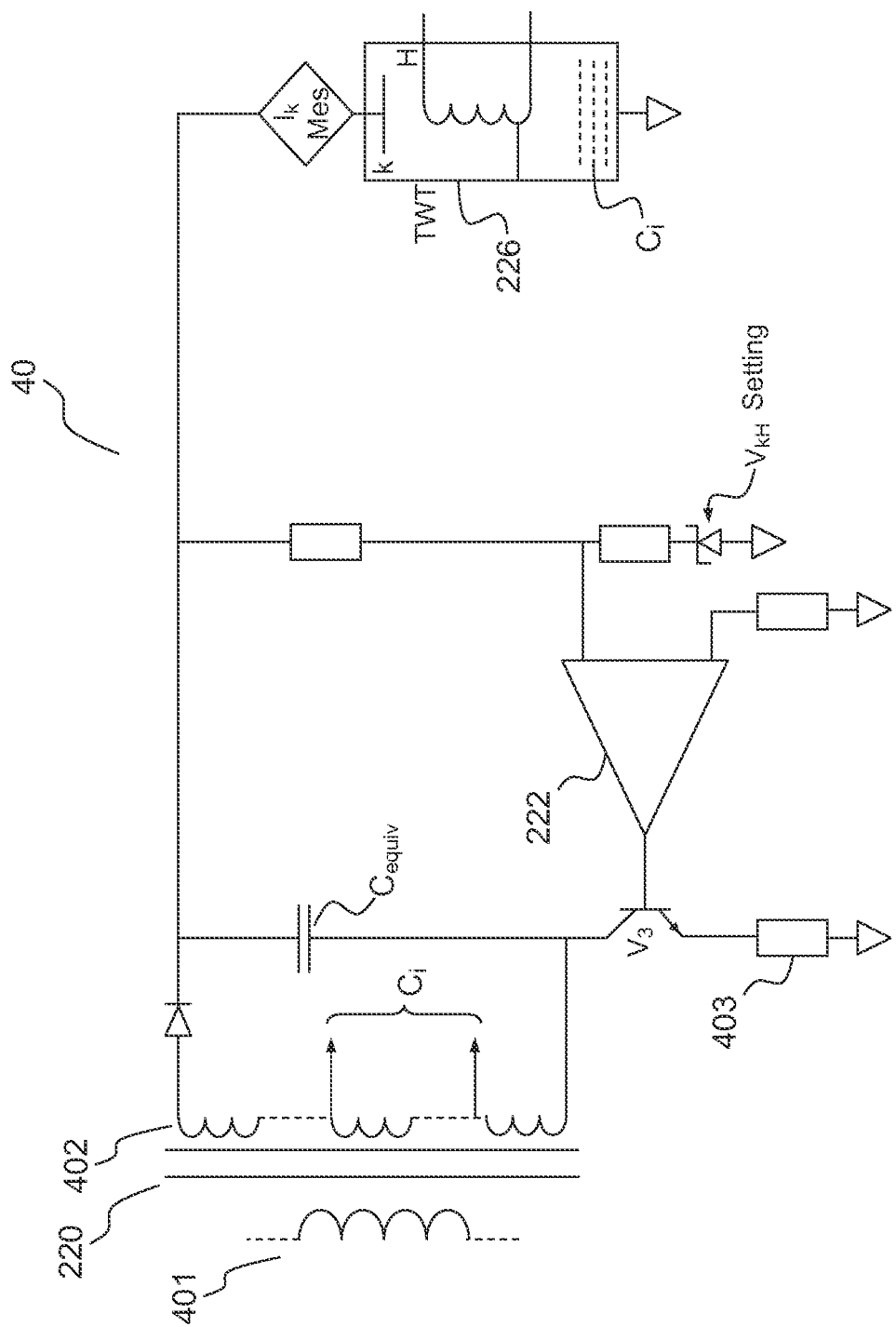
FIG. 4, a simplified electrical diagram depicting part of the high voltage stage of an EPC that is part of a flexible TWTA according to an exemplary embodiment of the current invention.

FIG. 4 presents a simplified electrical diagram depicting part of the high voltage stage of an EPC that is part of a flexible linearized travelling wave amplifier according to an exemplary embodiment of the current invention.

A high voltage generation and control module 40 implementing high voltage generation and control means 22 by reference to FIG. 2, comprises at its input the secondary side 402 of the high voltage transformer 220. Specific outputs of the secondary side 402 can be directly routed to the collectors $C_i$ of the TWT after rectifying and filtering. Each collector is associated with its dedicated winding, as well as notably its filtering capacitor. The sum of the capacitances of the capacitors dedicated to all collectors $C_i$ is represented on the figure as an equivalent capacitance $C_{equiv}$. Also, a rectifying diode D is represented on the figure in series with the secondary side 402 of the high voltage transformer 220, and in parallel with the equivalent capacitance $C_{equiv}$ branch. The secondary side 402 can also be connected to a helix voltage accuracy controller V3, driven by the regulator 222. The helix voltage controller V3 is attached to a dissipating element 403, itself for example attached to the ground. The regulator 222 is driven by the helix to cathode voltage $V_{KH}$ setting. The helix voltage accuracy controller V3 can be formed by a bipolar transistor, whose emitter is attached to the dissipating element 403, which can itself be formed by a resistance. The collector of the bipolar transistor is then attached to the secondary side 402 of the high voltage transformer 220. The helix to cathode voltage $V_{KH}$ setting can for example be done through adjusting the voltage of a Zener diode through appropriate voltage adjustment means.

The current invention proposes to transfer a part of the flexibility range directly to the primary side 401 of the high voltage transformer 220, through the control of the primary power converter 20, for example through the Buck type regulator 304, by reference to FIG. 3. Indeed, directly providing the full range of flexibility to the helix voltage through the regulator 222 imposes a high stress on the helix voltage controller V3, and induces excessive dissipations. It shall be observed here that the high voltage components are usually enclosed in an isolating resin aiming at preventing any risks of burst that may occur due to arking phenomena. For instance, if the helix to cathode voltage has to be controlled over a very large range, that would impose too much thermal energy to be dissipated, then the stress on the helix voltage controller V3. This can be alleviated thanks to the lowering of the voltage at the primary side 401 of the high voltage transformer 220, which can for example be achieved through adjusting the primary power converter 20, for example through the Buck type regulator 304. Adjusting the primary power converter 20 can be done through the regulation module 305, by reference to FIG. 3, and more specifically a reference voltage $V_{KCi}$ adjusting means, for example formed by a Zener diode whose voltage can be adjusted through appropriate means. In other words, the buck regulator setting voltage $V_{KCi}$ is acting on the primary side 401, and subsequently on all collector $C_i$ voltages, through their dedicated windings.

Advantageously, the high voltage transformer 220 output voltages can be changed in the same proportion, provided a ratio $V_{KH}/V_{KCi}$ between the helix to cathode voltage and the collector voltages constant, while reducing the level of stress on the helix series regulator 222. Keeping a constant ratio $V_{KH}/V_{KCi}$ between the helix to cathode voltage and the collector voltages allows ensuring stability of the TWT and is particularly advantageous for an operation over a wide range of helix to cathode voltages, for instance over a range higher than 50 Volts with a TWT operating in the Ku band. Another advantage of keeping this ratio constant lies in the fact it allows keeping the output of the TWT (that is: the ratio between the RF power and the consumed power) essentially constant over the whole range of operation.

FIG. 5 presents a simplified electrical diagram depicting a flexibility control module, comprised in a flexible linearized travelling wave amplifier according to an exemplary embodiment of the current invention.

A flexibility control module 50, implementing flexibility control means 24 as described below by reference to FIG. 2, can in an exemplary embodiment comprise the decoder 240 receiving control data through the data bus, and outputting two binary words. Input control binary words can be n-bit words, and the decoder 240 can forward one $V_{KH}$ setting control word to a first DAC 504 attached to a first shaping circuit 505, so as to generate an analog setting value for the helix to cathode reference voltage $V_{KH}$; in parallel, the decoder 240 can issue one $V_{KCi}$ setting control word to a second DAC 506, for example through a galvanic insulator 503, the second DAC 506 being also attached to a second shaping circuit 507, generating an analog setting value for the Buck regulator reference voltage $V_{KCi}$. The first and second shaping circuits 505, 507 can for example comprise amplifiers and filters.

As a more specific example, the data bus may input 8-bit control words to the decoder 240. The decoder can for example forward the 8-bit control words to the first DAC 504, and send 4-bit words, for example consisting of the four most significant bits of the 8-bit word, to the second DAC 506. Thus, the Buck type regulator reference voltage is set proportionally and with a lower resolution, compared to the helix to cathode reference voltage $V_{KH}$.

Advantageously, the set point can be forced, when switching on the EPC, to the middle value of the flexibility range, in order to avoid any stress on the TWT 226 during the transient phase.

For example, an EPC 300 may provide control of the helix voltage up to 8 kilovolts through remote commands via the onboard communication databus of the satellite, together with simultaneous control of the collector high voltages, ranging from 500 to 3500 Volts, while keeping the TWT efficient. The helix voltage can for example be set flexible within a range of 0 to 550 Volts around the nominal operating point, with a resolution lower than 2.5 Volts as afforded by an 8-bit control word. It shall be observed here that the nominal set operating point can be typically varied between 2.5 and 7.7 kilovolts, depending upon the frequency band requested by the intended application—for example in C-band, Ku-band Ka-band, etc. It shall be observed that the fine resolution thus achieved for adjusting the helix to cathode voltage allows a fine adaptation of the TWT phase response, typically in the order of about 1 degree per volt, and hence provides the opportunity of a fine tuning of the output RF signal phase.

The invention claimed is:

1. A travelling wave tube amplifier, comprising:
   a travelling wave tube comprising a cathode, a helix, a radio frequency (RF) input, an RF output, and a plurality of collectors; and
   an electronic power conditioner providing power supply and electrode polarization to said travelling wave tube, said electronic power conditioner including flexibility control means for adjusting, via control commands, the helix to a cathode voltage to allow an adjusting of the travelling wave tube operating frequency range, wherein the electronic power conditioner comprises primary control means comprising a power cell configured to drive a high voltage generation and control means comprising a multistage high voltage transformer whose primary side is controlled by said power cell and configured to generate high voltages requested by at least one collector in said plurality of collectors, said cathode and said helix, said flexibility control means comprising means for adjusting a voltage reference driving a voltage control loop, said voltage control loop configured to drive the power cell through pulse width modulation.

2. The travelling wave tube amplifier according to claim 1, wherein said flexibility control means are further configured to adjust voltages of the collectors, a ratio between a voltage of the helix to a cathode voltage and collector voltages remaining constant.

3. The travelling wave tube amplifier according to claim 1, wherein said control commands are sent through a databus.

4. The travelling wave tube amplifier according to claim 1, wherein the high voltage generation and control means comprise a regulator attached to a secondary side of said multistage high voltage transformer and supplying a helix to cathode voltage $V_{KH}$, being adjusted to a helix to cathode voltage reference in said flexibility control means.

5. The travelling wave tube amplifier according to claim 4, wherein said flexibility control means further comprise a decoder issuing signal control words from said control commands, said helix to cathode voltage reference comprising a first digital-to-analog converter converting binary output words generated by the decoder into an analog signal controlling the helix to cathode voltage $V_{KH}$.

6. The travelling wave tube amplifier according to claim 5, wherein said means for adjusting the voltage reference comprise a second digital-to-analog converter converting binary output words generated by the decoder based upon input binary words sent via a databus.

7. The travelling wave tube amplifier according to claim 6, wherein said decoder generates n-bit output words towards the helix to cathode voltage reference, and m-bit output words, m being lower than n, towards the means for adjusting the voltage reference, based upon n-bit input words received from the databus.

8. The travelling wave tube amplifier according to claim 7, wherein a number m of the m-bit output words towards the means for adjusting the voltage reference is chosen so as to allow adjusting an RF signal phase.

9. The travelling wave tube amplifier according to claim 4, wherein said high voltage generation and control means are implemented within a high voltage generation and control module comprising at an input, the secondary side of the multistage high voltage transformer further connected to a helix voltage accuracy controller formed by a bipolar transistor driven by the regulator, and an emitter of the bipolar transistor is attached to a ground through a dissipating element.

\* \* \* \* \*